(12) United States Patent
Kim et al.

(10) Patent No.: US 10,332,865 B2
(45) Date of Patent: Jun. 25, 2019

(54) METHOD OF FABRICATING LIGHT EMITTING DIODE MODULE

(71) Applicant: SAMSUNG ELECTRONICS CO., LTD., Suwon-si, Gyeonggi-do (KR)

(72) Inventors: Sun Kim, Hwaseong-si (KR); Jae Jun Bang, Hwaseong-si (KR); Chang Ho Shin, Incheon (KR); Dong Soo Lee, Seongnam-si (KR); Seog Ho Lim, Seongnam-si (KR); Myoung Sun Ha, Suwon-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 15 days.

(21) Appl. No.: 15/478,541

(22) Filed: Apr. 4, 2017

(65) Prior Publication Data
US 2018/0053750 A1 Feb. 22, 2018

(30) Foreign Application Priority Data
Aug. 22, 2016 (KR) .................. 10-2016-0106015

(51) Int. Cl.
*H01L 25/00* (2006.01)
*H01L 33/62* (2010.01)
*H01L 25/075* (2006.01)

(52) U.S. Cl.
CPC .......... *H01L 25/0753* (2013.01); *H01L 25/50* (2013.01); *H01L 33/62* (2013.01); *H01L 2224/16225* (2013.01)

(58) Field of Classification Search
CPC ..... H01L 25/0753; H01L 25/50; H01L 33/62; H01L 33/46; H01L 33/486; H01L 2933/0066; H01L 2933/0016; H01L 2933/0025; H01L 2933/0033; F21V 19/0025; F21Y 2115/10; F21Y 2103/10
See application file for complete search history.

(56) References Cited

U.S. PATENT DOCUMENTS

| | | |
|---|---|---|
| 6,372,608 B1 | 4/2002 | Shimoda et al. |
| 6,645,830 B2 | 11/2003 | Shimoda et al. |
| RE38,466 E | 3/2004 | Inoue et al. |
| 6,818,465 B2 | 11/2004 | Biwa et al. |
| 6,818,530 B2 | 11/2004 | Shimoda et al. |
| 6,858,081 B2 | 2/2005 | Biwa et al. |

(Continued)

FOREIGN PATENT DOCUMENTS

| | | |
|---|---|---|
| JP | 2004-155004 A | 6/2004 |
| JP | 2008-302567 A | 12/2008 |

(Continued)

*Primary Examiner* — Moazzam Hossain
*Assistant Examiner* — Stanetta D Isaac
(74) *Attorney, Agent, or Firm* — Lee & Morse, P.C.

(57) ABSTRACT

A method of fabricating a LED module includes preparing a circuit board, such that the circuit board includes a reflective laminate around a chip mounting region and an electrode pad in the chip mounting region, preparing a mask, such that the mask includes a protruding portion with a discharge hole, and the protruding portion is inserted into a space surrounded by the reflective laminate, dispensing solder paste onto the electrode pad using the mask, and bonding an electrode of a LED chip to the electrode pad of the circuit board using the solder paste.

20 Claims, 8 Drawing Sheets

(56) References Cited

U.S. PATENT DOCUMENTS

| | | |
|---|---|---|
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |
| 7,208,725 B2 | 4/2007 | Sherrer et al. |
| 7,288,758 B2 | 10/2007 | Sherrer et al. |
| 7,319,044 B2 | 1/2008 | Han et al. |
| 7,501,656 B2 | 3/2009 | Han et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,179,938 B2 | 5/2012 | Kim |
| 8,263,987 B2 | 9/2012 | Choi et al. |
| 8,324,646 B2 | 12/2012 | Lee et al. |
| 8,399,944 B2 | 3/2013 | Kwak et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 8,735,931 B2 | 5/2014 | Han et al. |
| 8,744,227 B2 | 6/2014 | Nakashiba et al. |
| 8,766,295 B2 | 7/2014 | Kim |
| 9,142,736 B2 | 9/2015 | Qiu et al. |
| 2010/0006215 A1* | 1/2010 | Kawakubo ............ B29C 43/021 156/245 |
| 2011/0243495 A1* | 10/2011 | Nakashiba ......... G02B 6/12002 385/14 |
| 2013/0032203 A1* | 2/2013 | Tam .................. H01L 31/02013 136/256 |
| 2015/0163925 A1 | 6/2015 | Nakatsuji et al. |
| 2015/0214445 A1* | 7/2015 | Qiu ........................ H01L 27/15 257/88 |

FOREIGN PATENT DOCUMENTS

| | | |
|---|---|---|
| JP | 2011-181663 A | 9/2011 |
| JP | 2014-184574 A | 10/2014 |
| KR | 10-2003-0085188 A | 11/2003 |
| KR | 10-2015-0053538 A | 5/2015 |

* cited by examiner

METHOD OF FABRICATING LIGHT EMITTING DIODE MODULE

CROSS-REFERENCE TO RELATED APPLICATION

Korean Patent Application No. 10-2016-0106015, filed on Aug. 22, 2016, in the Korean Intellectual Property Office, and entitled: "Method of Fabricating Light Emitting Diode Module," is incorporated by reference herein in its entirety.

BACKGROUND

1. Field

The present disclosure relates to a method of fabricating a light emitting diode (LED) module.

2. Description of the Related Art

Semiconductor light emitting diodes (LEDs) may be provided as devices in which materials included therein emit light when electrical energy is applied thereto. Semiconductor LEDs may convert energy, generated when electrons and holes of a p-n joint are recombined, into light, and emit the light. LEDs have been widely used as light sources of backlight devices used in lighting devices and large liquid crystal displays (LCDs).

In general, LED modules may have various additional structures in order to improve light extraction efficiency. Due to the provision of such structures, the process of modularizing LEDs may be complicated, thus causing defects.

SUMMARY

According to an example embodiment, a method of fabricating an LED module may include preparing a circuit board having a reflective laminate disposed around a chip mounting region and an electrode pad disposed in the chip mounting region; dispensing solder paste onto the electrode pad using a mask having a protruding portion in which a discharge hole is formed, the protruding portion being configured to be inserted into a space surrounded by the reflective laminate; and bonding an electrode of an LED chip to the electrode pad using the solder paste.

According to an example embodiment, a method of fabricating an LED module may include preparing a circuit board including a reflective laminate providing a chip mounting region and an electrode pad exposed in the chip mounting region; preparing a metal mask including a protruding portion in which a discharge hole is formed; arranging the metal mask to allow the protruding portion to be inserted into the chip mounting region; dispensing solder paste onto the electrode pad through the discharge hole while the metal mask is arranged; and bonding an electrode of an LED chip to the electrode pad using the solder paste.

According to an example embodiment, a metal mask may include a first metal plate having a first hole; at least one second metal plate stacked in a region of the first metal plate and having a second hole connected to the first hole; and a third metal plate stacked on the second metal plate and having a third hole connected to the second hole. In addition, the second metal plate and the third metal plate may be provided as a convex structure (or a protruding portion) on a surface of the first metal plate.

According to an example embodiment, a method of fabricating a LED module includes preparing a circuit board with at least one electrode pad in a chip mounting region; forming a reflective laminate on the circuit board, such that the reflective laminate surrounds the chip mounting region; preparing a mask, such that the mask includes a protruding portion with a discharge hole; aligning the mask above the circuit board, such that the protruding portion is inserted into a space surrounded by the reflective laminate; dispensing solder paste from the mask onto the electrode pad through the discharge hole; and bonding an electrode of a LED chip to the electrode pad of the circuit board using the solder paste.

BRIEF DESCRIPTION OF THE DRAWINGS

Features will become apparent to those of ordinary skill in the art by describing in detail exemplary embodiments with reference to the attached drawings, in which:

FIGS. 12 to 15 illustrate examples of the metal mask employable in various example embodiments.

DETAILED DESCRIPTION

Hereinafter, example embodiments will be described as follows with reference to the attached drawings.

Figure 1:
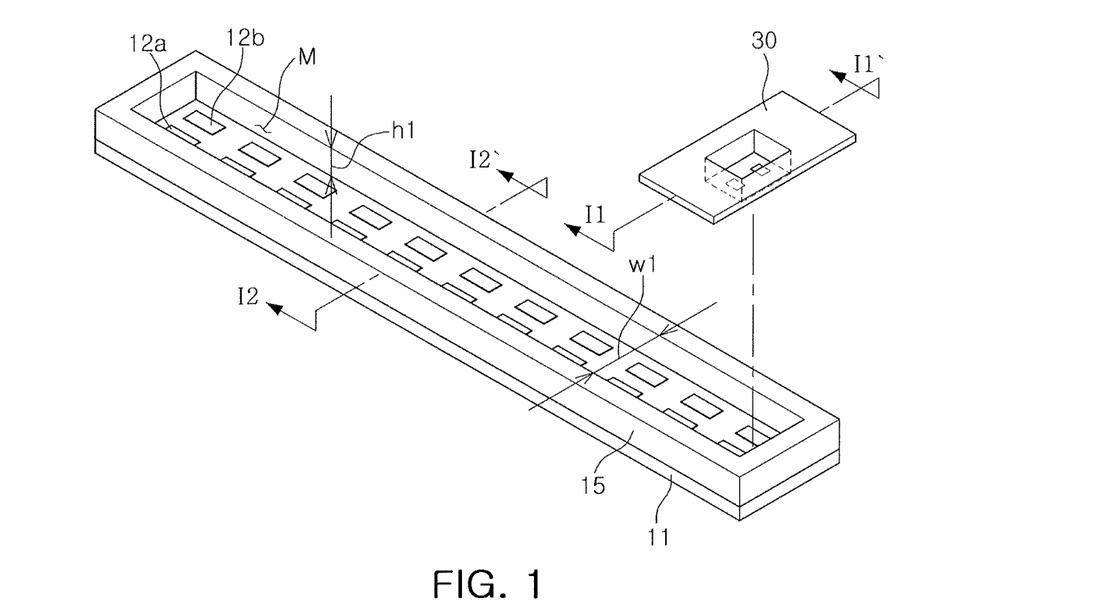
FIG. 1 illustrates a schematic perspective view of a metal mask used in fabricating a LED module and a circuit board, according to an example embodiment.
Figure 2A:
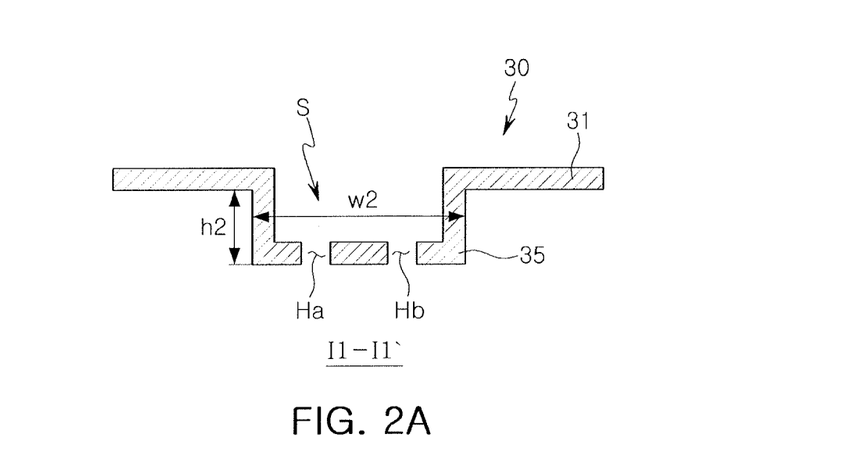
FIGS. 2A and 2B illustrate a cross-sectional view and a top view of the metal mask illustrated in FIG. 1, respectively.
Figure 2B:
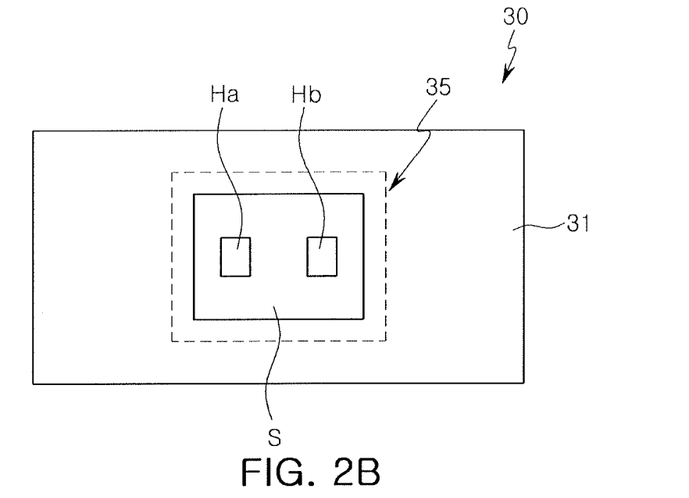

FIG. 1 is a schematic perspective view of a metal mask used in fabricating a light emitting diode (LED) module and a circuit board, according to an example embodiment. FIGS. 2A and 2B illustrate a cross-sectional view and a top view of the metal mask in FIG. 1, respectively;

With reference to FIG. 1, a circuit board 11 may include a reflective laminate 15 disposed around a chip mounting region M and a plurality of electrode pads 12a and 12b disposed in the chip mounting region M. The plurality of electrode pads 12a and 12b may be configured to be connected to different circuit patterns disposed on the circuit board 11.

With reference to FIGS. 1 and 2A-2B, a metal mask 30 may include a base plate 31 and a protruding portion 35 disposed below the base plate 31. For example, the metal mask 30 may be positioned over the reflective laminate 15 to have the edges of the base plate 31 extend over and overlap the reflective laminate 15, and to have the protruding portion 35 extend from the base plate 31 toward the chip mounting region M. The protruding portion 35 may be configured to be inserted into a space o the circuit board 11 surrounded by the reflective laminate 15. A width w2 of the protruding portion 35 (FIG. 2A) may be less than a width w1 of the chip mounting region M (FIG. 1). The protruding portion 35 may be configured not to be in direct contact with the electrode pads 12a and 12b, but embodiments are not limited thereto. In addition, a height h2 of the protruding portion 35 (FIG. 2A) may be less than a height h1 of the reflective laminate 15 (FIG. 1).

As illustrated in FIGS. 2A and 2B, the protruding portion 35 may have discharge holes Ha and Hb open in a downward direction, e.g., openings facing the chip mounting region M. The discharge holes Ha and Hb may be provided as openings through which solder paste is discharged, and may control an amount and a size of solder disposed on the electrode pads 12a and 12b, e.g., by controlling diameters of the discharge holes Ha and Hb. For example, in a case in which solder paste is provided to a first electrode pad 12a and a second electrode pad 12b, simultaneously, the protruding portion 35 may, e.g., be positioned to, have the discharge holes Ha and Hb in a region corresponding to, e.g., overlapping, positions of the first electrode pad 12a and the second electrode pad 12b.

The metal mask 30 may have a receiving space S to receive, e.g., accommodate, solder paste, connected to the discharge holes Ha and Hb, e.g., the receiving space S may be in fluid communication with the discharge holes Ha and Hb. The receiving space S may include an opening open in an upward direction, e.g., opposite to the discharge holes Ha and Hb. The receiving space S may be used as a space for temporarily storing solder paste, in order to provide solder paste in a desired amount through the discharge holes Ha and Hb.

FIGS. 3 to 6 are cross-sectional views in respective main processes, illustrating a method of fabricating an LED module, according to an example embodiment.

Figure 3:
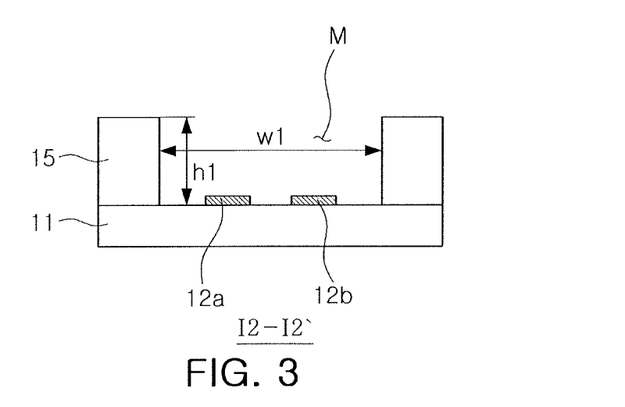
FIGS. 3 to 6 illustrate cross-sectional views of stages in a method of fabricating a LED module, according to an example embodiment.

With reference to FIG. 3, the circuit board 11, including the reflective laminate 15, the first electrode pad 12a, and the second electrode pad 12b, may be provided. The circuit board 11 in FIG. 3 is a cross-sectional view along line 12-12' of FIG. 1.

In detail, the circuit board 11 may be provided as a printed circuit board (PCB). The chip mounting region M may be defined by the reflective laminate 15, and may include the first electrode pad 12a and the second electrode pad 12b disposed therein. The reflective laminate 15 may be provided as a structure to improve light extraction efficiency, and may have a structure in which a plurality of films 15a (FIG. 7) having reflectivity are stacked to have a required thickness (e.g., 0.2 mm to 1.0 mm).

Figure 7:
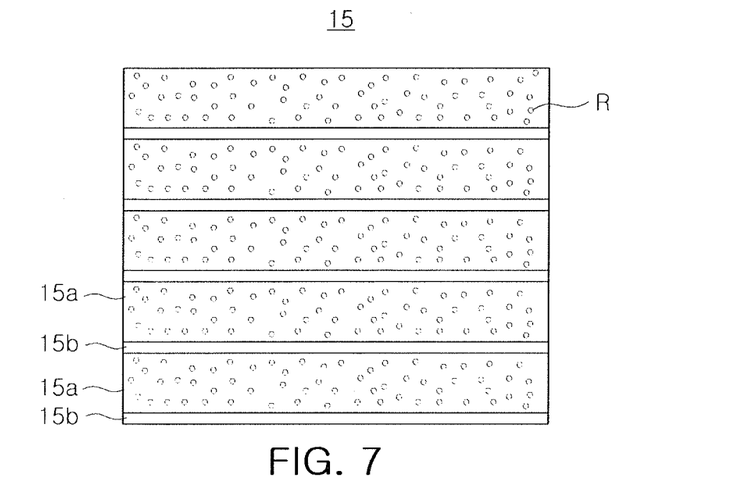
FIG. 7 illustrates a cross-sectional view of a reflective laminate employed in a circuit board illustrated in FIG. 3.

A cross-sectional structure of the reflective laminate 15 is illustrated in FIG. 7. As illustrated in FIG. 7, the reflective laminate 15 may include a plurality of reflective films 15a (referred to hereinafter as "a first resin layer") formed using a resin including a reflective powder R, and a plurality of bonding layers 15b alternately stacked with the plurality of reflective films 15a. For example, a relatively thin reflective film 15a may be stacked a number of times (e.g., five times) using the bonding layer 15b, thus fabricating the reflective laminate 15 with a desired thickness.

A resin forming the reflective film 15a may include, e.g., silicone, epoxy, polyacrylate, polyimide, and a urethane resin. The reflective powder R may be provided as, e.g., white ceramic powder or metal powder. For example, the white ceramic powder may include at least one of titanium dioxide ($TiO_2$), aluminum oxide ($Al_2O_3$), niobium pentoxide ($Nb_2O_5$) and zinc oxide (ZnO). The metal powder may be, e.g., aluminum (Al) or silver (Ag). The bonding layer 15b may include, e.g., a silicon resin composition, an epoxy resin composition, a polyimide composition, and a modified resin thereof. The reflective laminate 15 employable in the example embodiment may be modified and provided to have various forms, as will be described in more detail below with reference to FIGS. 8 and 9.

Figure 4:
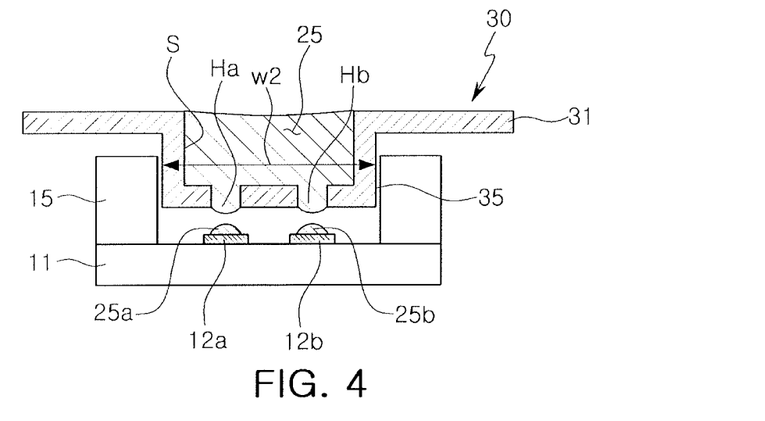

With reference to FIG. 4, solder paste 25 may be filled in the receiving space S of the metal mask 30, and the metal mask 30 with the solder paste 25 may be positioned over the chip mounting region M of the circuit board 11. Next, the solder paste 25 may be dropped, e.g., disposed, onto the first electrode pad 12a and the second electrode pad 12b through the discharge holes Ha and Hb, respectively, of the metal mask 30.

In detail, the metal mask 30 may be aligned so that the protruding portion 35 including the discharge holes Ha and Hb formed therein may be disposed in the chip mounting region M. After the metal mask 30 is aligned, the solder paste 25 may be provided to the receiving space S of the metal mask 30, and a predetermined amount of the solder paste 25 may be dropped, e.g., disposed, onto the first electrode pad 12a and the second electrode pad 12b through the discharge holes Ha and Hb. For example, in a manner similar to a squeezing process, the solder paste 25 may be compressed through the opening, and thus a desired amount of the solder paste 25 may be dropped through the discharge holes Ha and Hb.

The protruding portion 35 may be inserted into a space defined by the reflective laminate 15, i.e., to be in close proximity to the chip mounting region M, for the solder paste 25 to be provided. Thus, a distance between a bottom of the protruding portion 35 facing the chip mounting region M and the electrode pads 12a and 12b may be reduced, i.e., a distance for the solder paste 25 to be dropped may be reduced. Therefore, solder balls 25a and 25b disposed onto the first and second electrode pads 12a and 12b, respectively, may be provided in precise positions. In addition, an effect of a drop impact thereof may be reduced, so that the solder balls 25a and 25b may be formed without being dissipated, i.e., without being spread.

Figure 5:
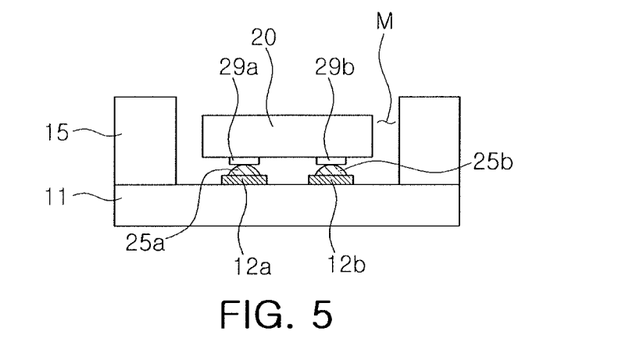

With reference to FIG. 5, a LED chip 20 may be mounted on the first electrode pad 12a and the second electrode pad 12b, on which the solder balls 25a and 25b are disposed. The LED chip 20 employed in the example embodiment may have a flip-chip structure in which a first electrode 29a and a second electrode 29b are disposed on a lower surface thereof. The first electrode 29a and the second electrode 29b may be mounted on the solder balls 25a and 25b disposed on the first electrode pad 12a and the second electrode pad 12b. Various examples of the LED chip 20 or a LED chip 100 employable in the example embodiment will described in FIGS. 10 and 11, in detail.

Figure 6:
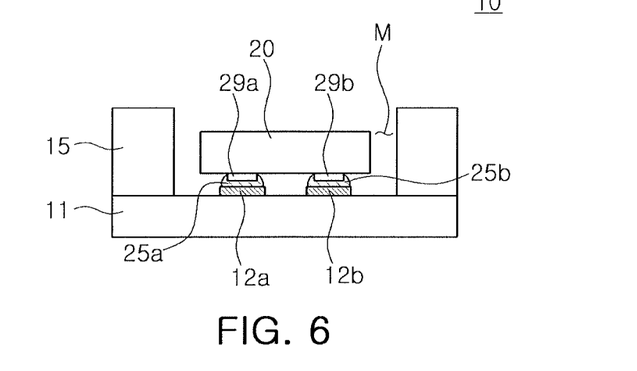

With reference to FIG. 6, the first electrode 29a and the second electrode 29b of the LED chip 20 may be bonded to the first electrode pad 12a and the second electrode pad 12b, respectively, using the solder balls 25a and 25b.

A bonding process described above may be performed in such a manner that the solder balls 25a and 25b are heated and dissolved. Dissolved solder balls may allow the first electrode 29a and the second electrode 29b to be bonded to the first electrode pad 12a and the second electrode pad 12b, and may be solidified. A heating process described above may be performed in such a manner that heat is transferred to the first electrode pad 12a and the second electrode pad 12b through a circuit pattern of the circuit board 11.

Figure 8:
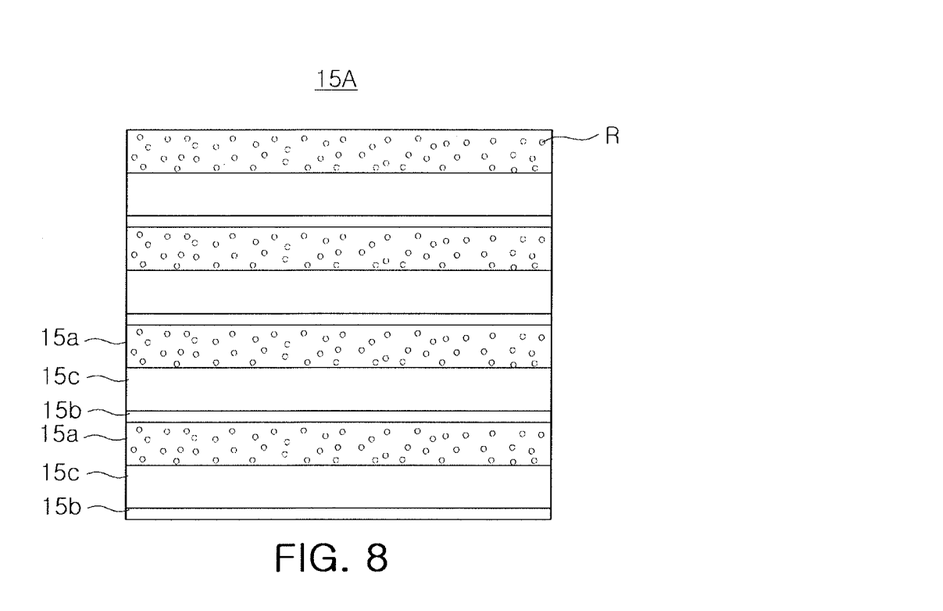
FIGS. 8 and 9 illustrate cross-sectional views of examples of a reflective laminate employable in various example embodiments.
Figure 9:
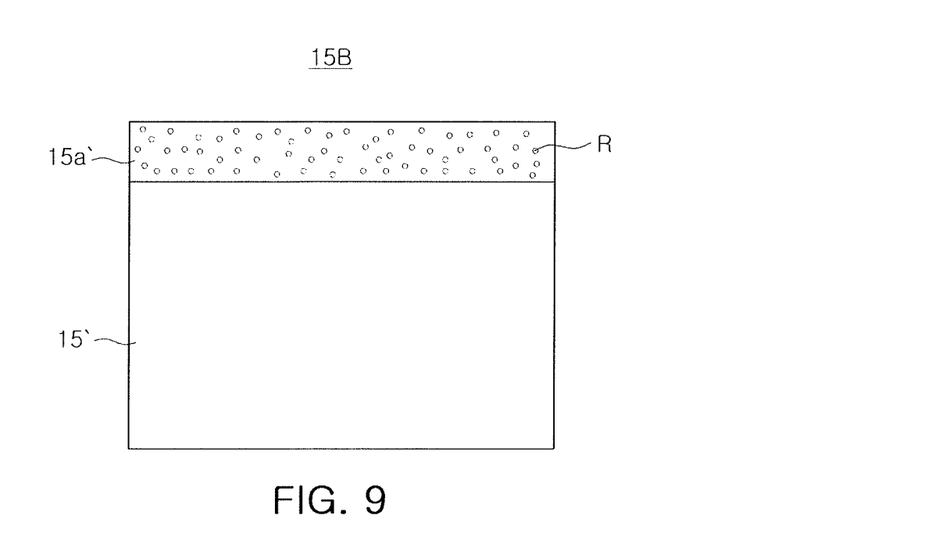

It is noted that a circuit board that may be used in the example embodiment may adopt various other types of reflective laminates besides the reflective laminate 15 illustrated in FIG. 7, as will be described in detail with reference to FIGS. 8-9 below. FIGS. 8 and 9 are cross-sectional views of examples of a reflective laminate employable in various example embodiments.

With reference to FIG. 8, a reflective laminate 15A, according to the example embodiment, may have a structure in which the first resin layer 15a, a second resin layer 15c, and the bonding layer 15b are alternately stacked. The first resin layer 15a may be formed using a resin containing the reflective powder R. The second resin layer 15c may be provided as a resin layer not containing the reflective powder R. In an example embodiment, the second resin layer 15c may be provided as a base film used to fabricate the first resin layer 15a. Therefore, the first resin layer 15a and the second resin layer 15c may be provided, while the first resin layer 15a and the second resin layer 15c are bonded to each other.

In the example embodiment, the bonding layer 15b may be provided on a lower surface of the second resin layer 15c, and may be bonded to an upper surface of the first resin layer 15a. As such, a bonded body including the first resin layer 15a and the second resin layer 15c may be stacked a plurality of times (e.g., four times) using the bonding layer 15b, thus fabricating the reflective laminate 15A having a desired thickness. In detail, a resin forming the first resin layer 15a and the second resin layer 15c may be provided as, e.g., silicone, epoxy, polyacrylate, polyimide, and a urethane resin.

With reference to FIG. 9, a reflective laminate 15B, according to the example embodiment, may include a resin material body 15' having a specific height and a reflective resin layer 15a' coated on a surface of the resin material body 15' and containing the reflective powder R. The resin material body 15' may be formed using a material similar to that of the circuit board 11, but is not limited thereto. For example, the resin material body 15' may be provided as a glass-reinforced epoxy film, e.g., FR4. A thickness of the reflective laminate 15B may be defined by the resin material body 15'.

The reflective resin layer 15a' may be bonded to the resin material body 15' by a separate bonding layer. However, the reflective resin layer 15a' may be provided in such a manner that a reflective liquid resin is provided, the reflective resin layer 15a' is coated with the reflective liquid resin, and the reflective liquid resin is hardened. The example embodiment illustrates a case in which the reflective resin layer 15a' is only coated on an upper surface of the resin material body 15'. However, according to need, the reflective resin layer 15a' may be additionally provided to other side surfaces, thus improving reflection efficiency.

Figure 10:
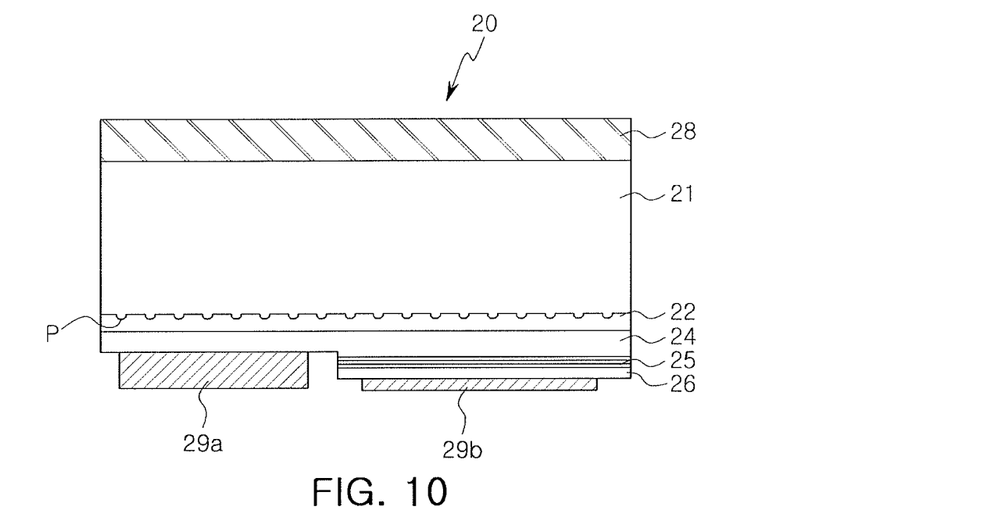
FIGS. 10 and 11 illustrate cross-sectional views of examples of a LED chip employable in various example embodiments.
Figure 11:
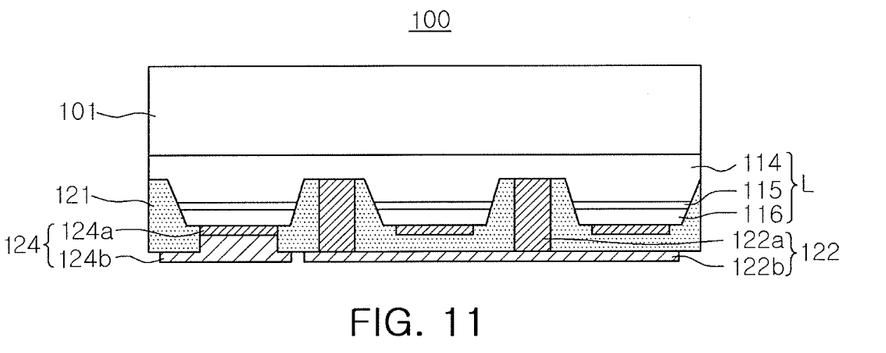

FIGS. 10 and 11 are cross-sectional views of examples of a LED chip employable in various example embodiments.

As illustrated in FIG. 10, the LED chip 20, i.e., a semiconductor LED chip 20, employed in the example embodiment, may include a substrate 21, and may include a first conductive semiconductor layer 24, an active layer 25, and a second conductive semiconductor layer 26, stacked on the substrate 21 in sequence. A buffer layer 22 may be disposed between the substrate 21 and the first conductive semiconductor layer 24.

The substrate 21 may be provided as an insulating substrate, e.g., sapphire, but is not limited thereto. The substrate 21 may be provided as a conductive substrate or a semiconductor substrate besides an insulating substrate. For example, the substrate 21 may be formed using silicon carbide (SiC), silicon (Si), magnesium aluminate ($MgAl_2O_4$), magnesium oxide (MgO), lithium aluminate ($LiAlO_2$), lithium gallate ($LiGaO_2$), and gallium nitride (GaN), besides sapphire. The substrate 21 may include a concave-convex portion P formed on an upper surface thereof. The concave-convex portion P may improve light extraction efficiency and quality of a single crystal.

The buffer layer 22 may be provided as $In_xAl_yGa_{1-x-y}N$ (0≤x≤1, 0≤y≤1). For example, the buffer layer 22 may be formed using GaN, aluminum nitride (AlN), aluminum gallium nitride (AlGaN), and indium gallium nitride (InGaN). According to need, the buffer layer 22 may be formed through a composition of a plurality of semiconductor layers or by gradually changing the composition of a semiconductor.

The first conductive semiconductor layer 24 may be provided as an n-type nitride semiconductor satisfying $In_xAl_yGa_{1-x-y}N$ (0≤x≤1, 0≤y<1, 0≤x+y<1). In addition, an n-type impurity may be, e.g., Si. For example, the first conductive semiconductor layer 24 may include n-type GaN. The second conductive semiconductor layer 26 may be provided as a p-type nitride semiconductor layer satisfying $In_xAl_yGa_{1-x-y}N$ (0≤x<1, 0≤y<1, 0≤x+y<1). In addition, a p-type impurity may be, e.g., magnesium (Mg). In the meantime, the second conductive semiconductor layer 26 may be formed to have a single layer structure, but may have a multilayer structure having different compositions, as illustrated in the example embodiment. The active layer 25 may have a multiple quantum well (MQW) structure in which a quantum well layer and a quantum barrier layer are alternately stacked. In detail, the quantum well layer and the quantum barrier layer may be provided as $In_xAl_yGa_{1-x-y}N$ (0≤x≤1, 0≤y≤1, 0≤x+y≤1) having different compositions. In a specific example embodiment, the quantum well layer may be provided as $In_xGa_{1-x}N$ (0<x≤1), while the quantum barrier layer may be provided as GaN or AlGaN. Respective thicknesses of the MQW and the quantum barrier layer may be about 1 nm to about 50 nm. The active layer 25 is not limited to the MQW structure, but may have a single quantum well structure.

The first electrode 29a and the second electrode 29b may be disposed in a mesa-etched region of the first conductive semiconductor layer 24 and the second conductive semiconductor layer 26, respectively, thereby being disposed on the same surface (a first surface). The first electrode 29a may include, e.g., Ag, nickel (Ni), Al, chromium (Cr), rhodium (Rh), palladium (Pd), iridium (Ir), ruthenium (Ru), magnesium (Mg), zinc (Zn), platinum (Pt), gold (Au), or the like, and may have a structure of a single layer or two or more layers, but is not limited thereto. According to need, the second electrode 29b may be provided as a transparent electrode, e.g., a transparent conductive oxide or a transparent conductive nitride, or may include graphene. The second electrode 29b may include at least one among, e.g., Al, Au, Cr, Ni, titanium (Ti), and tin (Sn).

A wavelength conversion film 28 may be disposed on an upper surface (that is, a second surface) of the LED chip 20. The wavelength conversion film 28 may include a wavelength conversion material converting a portion of light emitted by the semiconductor LED chip 20 into light having a different wavelength. The wavelength conversion film 28 may be provided as a resin layer in which the wavelength conversion material is distributed or a ceramic film including a sintered ceramic phosphor. The semiconductor LED chip 20 may emit blue light. In addition, the wavelength conversion film 28 may convert a portion of the blue light into yellow light, or red and green light, and emit white light.

FIG. 11 is a cross-sectional view of an example of a semiconductor LED employable in the example embodiment.

With reference to FIG. 11, a semiconductor LED chip 100 may include a semiconductor laminate L formed on a substrate 110. The semiconductor laminate L may include a first conductive semiconductor layer 114, an active layer 115, and a second conductive semiconductor layer 116.

The semiconductor LED chip 100 may include a first electrode 122 and a second electrode 124, connected to the first conductive semiconductor layer 114 and the second conductive semiconductor layer 116, respectively. The first electrode 122 may include a connection electrode portion 122a, such as a conductive via, penetrating through the second conductive semiconductor layer 116 and the active layer 115 to be connected to the first conductive semiconductor layer 114, and may include a first electrode pad 122b connected to the connection electrode portion 122a. The connection electrode portion 122a may be surrounded by an insulating portion 121, and may be electrically isolated from the active layer 115 and the second conductive semiconductor layer 116. The connection electrode portion 122a may be disposed in a region in which the semiconductor laminate L is etched. A number, a form, and a pitch of the connection electrode portion 122a or an area in which the connection electrode portion 122a is in contact with the first conductive semiconductor layer 114 may be appropriately designed, in order to allow contact resistance to be reduced. In addition, the connection electrode portion 122a may be arrayed in rows and columns on the semiconductor laminate L, thus improving electric current flow. The second electrode 124 may include an ohmic contact layer 124a on the second conductive semiconductor layer 116 and a second electrode pad 124b.

The connection electrode portion 122a may have a single layer structure or a multilayer structure in which the first conductive semiconductor layer 114 has ohmic contact properties with respect to a conductive material, while the ohmic contact layer 124a may have a single layer structure or a multilayer structure in which the second conductive semiconductor layer 116 has ohmic contact properties with respect to a conductive material. For example, the connection electrode portion 122a and the ohmic contact layer 124a may be formed using a process of evaporating or sputtering one or more materials among Ag, Al, Ni, Cr, a transparent conductive oxide (TCO), and the like.

The first electrode pad 122b and the second electrode pad 124b may be connected to the connection electrode portion 122a and the ohmic contact layer 124a, respectively, and may function as an external terminal of the semiconductor LED chip 100. For example, the first electrode pad 122b and the second electrode pad 124b may include Au, Ag, Al, Ti, tungsten (W), copper (Cu), tin (Sn), Ni, platinum (Pt), Cr, nickel-tin (NiSn), titanium-tungsten (TiW), gold-tin (AuSn) or a eutectic metal thereof.

The first electrode 122 and the second electrode 124 may be disposed in the same direction, and may be disposed on a lead frame, or the like, in flip-chip form.

In the meantime, the two electrodes 122 and 124 may be electrically isolated from each other by the insulating portion 121. Any material that has electrical insulating properties may be used as the insulating portion 121. In addition, any material that has electrical insulating properties may be employed, but a material having a relatively low light absorption rate may be used. For example, a silicon oxide and a silicon nitride, e.g., silicon dioxide ($SiO_2$), $SiO_xN_y$, $Si_xN_y$, or the like, may be used. According to need, a light reflective filler may be distributed in a light transmissive material, thus forming a light reflecting structure. Alternatively, the insulating portion 121 may have a multilayer reflection structure in which a plurality of insulating films having different refractive indices are alternately stacked. In more detail, the multilayer reflection structure may be provided as a distributed bragg reflector (DBR) in which a first insulating film having a first refractive index and a second insulating film having a second refractive index are alternately stacked.

The multilayer reflection structure may be formed in such a manner that the plurality of insulating films having different refractive indices are alternately stacked two to a hundred (100) times. For example, the plurality of insulating films may be alternately stacked three to seventy (70) times, further, four to fifty (50) times. Each of the plurality of insulating films in the multilayer reflection structure may be provided as an oxide and a nitride, e.g., $SiO_2$, SiN, $SiO_xN_y$, $TiO_2$, $Si_3N_4$, $Al_2O_3$, TiN, AlN, $ZrO_2$, TiAlN, TiSiN, or the like, and combinations thereof.

For example, in a case in which a wavelength of light generated by the active layer 115 is referred to as λ, and a refractive index of an insulating film is referred to as n, the first insulating film and the second insulating film may be formed to be λ/4n in thickness, in detail, about 300 Å to about 900 Å in thickness. In this case, the multilayer reflection structure may be designed in such a manner that a refractive index and a thickness of each of the first insulating film and the second insulating film are selected, in order to have a high degree of reflectivity (e.g., 95% or higher) with respect to a wavelength of light generated by the active layer 115.

Refractive indices of the first insulating film and the second insulating film may be determined to be about 1.4 to about 2.5, and may be less than those of the first conductive semiconductor layer 114 and the substrate 101. However, the refractive indices of the first insulating film and the second insulating film may be less than that of the first conductive semiconductor layer 114, but greater than that of the substrate 101.

A metal mask having various structures may be used as a metal mask used in a method of fabricating a LED module according to an example embodiment. FIGS. 12 to 15 illustrate various examples of a metal mask.

Figure 12:
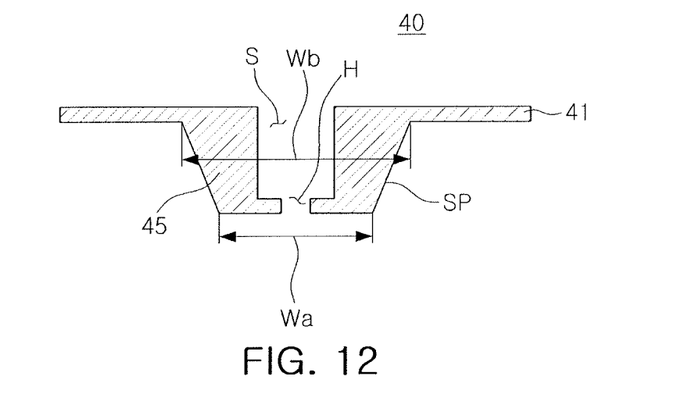

First, with reference to FIG. 12, a metal mask 40 may include a plate 41 and a protruding portion 45 disposed below the plate 41.

The metal mask 40 may have a structure formed in such a manner that a single material is processed, in a manner similar to the metal mask 30 illustrated in FIG. 2A. For example, the metal mask 40 may be fabricated in such a manner that a rectangular bulk, e.g., SUS material, is processed using a chemical etching process or a mechanical polishing process.

The protruding portion 45, employed in the example embodiment, may have an inclined side plane SP. The protruding portion 45 may have a structure in which a width Wb in an upper portion is greater than a width Wa in a lower portion thereof. Therefore, ease of the insertion of the protruding portion 45 into the chip mounting region may be facilitated.

The protruding portion 45 may include a single discharge hole H open in a downward direction. The metal mask 40 may include the receiving space S to receive solder paste, connected to the discharge hole H. The receiving space S may have an opening open in an upward direction.

A number and a diameter of the discharge hole H may vary. In an example embodiment, discharge holes corresponding to a number and a position of electrode pads related to a single LED chip may be provided (see FIG. 2A). In a different example embodiment, an array of a plurality of discharge holes may be provided, in order to allow a solder printing process to be performed on electrode pads of two LED chips or more, simultaneously.

The metal mask, according to the example embodiment, may be formed in such a manner that a single material is not processed, but a plurality of plates are bonded.

Figure 13A:
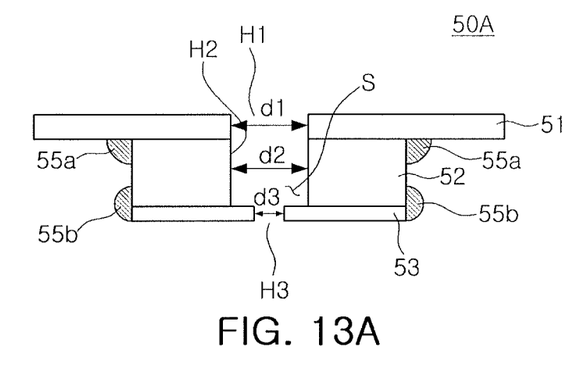
Figure 13B:
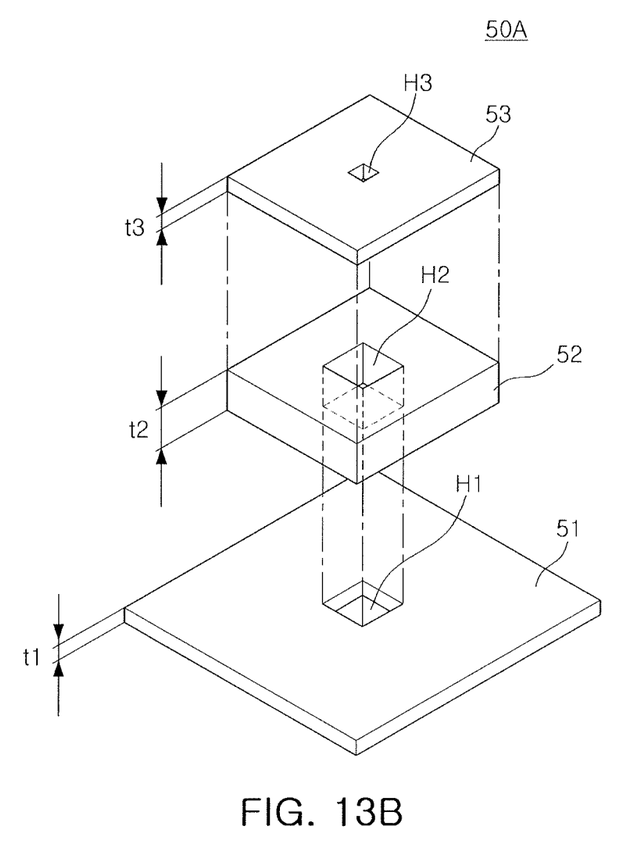

FIG. 13A is a cross-sectional view of a metal mask in which a plurality of metal plates are stacked, while FIG. 13B is an exploded perspective view of the metal mask illustrated in FIG. 13A.

With reference to FIGS. 13A and 13B, a metal mask 50A, according to the example embodiment, may include a first metal plate 51 having a first hole H1, and may include a second metal plate 52, and a third metal plate 53, stacked in a region of the first metal plate 51 in sequence. The second metal plate 52 and the third metal plate 53 may be provided as a protruding portion.

The first metal plate 51, the second metal plate 52, and the third metal plate 53 may be bonded to each other in such a manner that external surfaces thereof are welded, but embodiments are not limited thereto. As illustrated in FIG. 13A, the first metal plate 51 may be bonded to the second metal plate 52, and the second metal plate 52 may be bonded to the third metal plate 53 by welded portions 55a and 55b connecting plates disposed adjacently to a region of the external surfaces.

The second metal plate 52 and the third metal plate 53 may have a second hole H2 and a third hole H3, respectively. The second metal plate 52 and the third metal plate 53 may be disposed on the first metal plate 51 to allow the second hole H2 and the third hole H3 to be connected to the first hole H1.

In the example embodiment, a size (or a diameter) d1 of the first hole H1 may be equal to or similar to a diameter d2 of the second hole H2, while a diameter d3 of the third hole H3 may be less than a diameter d1 of the first hole H1 and a diameter d2 of the second hole H2. The first hole H1 and the second hole H2 may be provided as a receiving space S to receive solder paste, while the third hole H3 may be provided as a discharge hole.

The first metal plate 51, the second metal plate 52, and the third metal plate 53 may be formed to have the same thickness, but may have different thicknesses, according to need. In detail, a thickness of the second metal plate 52 may be different from that of at least one of the first metal plate 51 and the third metal plate 53. In the example embodiment, a thickness t2 of the second metal plate 52 may be greater than a thickness t1 of the first metal plate 51 and a thickness t3 of the third metal plate 53. The thickness t1 of the first metal plate 51 may be equal to or similar to the thickness t3 of the third metal plate 53, but the present inventive concept is not limited thereto.

Figure 14:
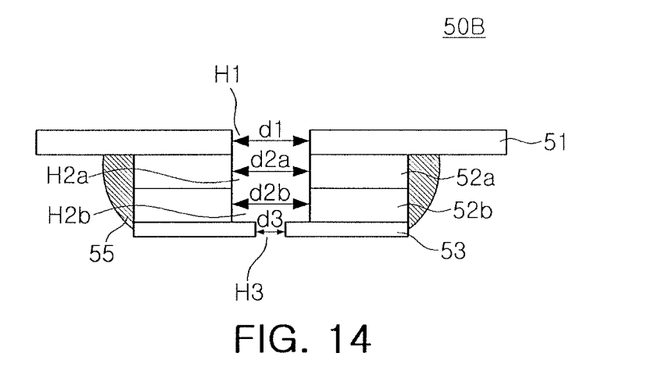

With reference to FIG. 14, a metal mask 50B may construed as being similar to a metal mask 50A illustrated in FIG. 13A, except that the metal mask 50B includes a plurality of second metal plates 52a and 52b, and a welded portion 55 has a different form.

A second metal plate, employed in the example embodiment, may include two second metal plates 52a and 52b. Holes H2a and H2b, formed in the two second metal plates 52a and 52b, may have the same diameter (d2a=d2b). In addition, diameters of the holes H2a and H2b may correspond to a diameter d1 of a hole of the first metal plate 51, and the holes H2a and H2b may be provided as a receiving space. A plurality of second metal plates 52a and 52b may be connected to the first metal plate 51 and the third metal plate 53 by a single welded portion 55.

Figure 15:
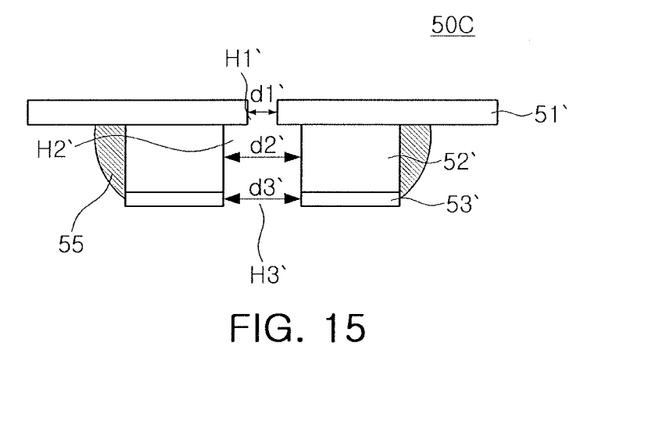

With reference to FIG. 15, a metal mask 50C may be construed as being similar to a metal mask illustrated in FIG. 13A except that holes H1', H2', and H3' are different in diameter, and a welded portion 55 have a different form. A first metal plate 51, a second metal plate 52, and a third metal plate 53 may be connected to each other by a single welded portion 55, in a manner similar to an example illustrated in FIG. 14.

In addition, as illustrated in FIG. 15, a diameter d2' of a second hole H2' may be equal to or similar to a diameter d3' of a third hole 113', while a diameter d1' of a first hole H1' may be less than the diameter d2' of the second hole H2' and the diameter d3' of the third hole H3'. In the example embodiment, the first hole H1' may be provided as a discharge hole determining an amount of solder (or a size) of a solder ball. The second hole 112' and the third hole H3' may be provided as a path of solder paste dropped through the first hole H1'. In a specific example, a lower surface of a third metal plate 53' may adhere to a surface of an electrode pad or a chip mounting region, thus preventing solder paste from spattering or flowing into an undesired region.

Figure 16:
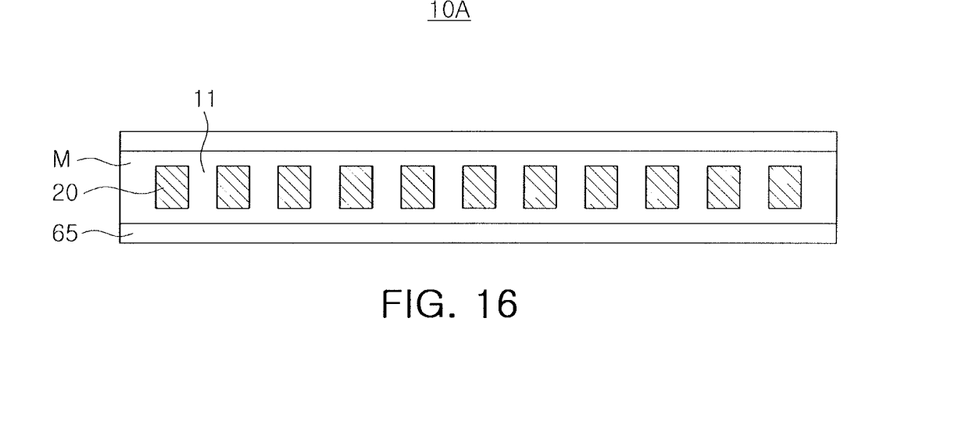
FIGS. 16 to 18 illustrate examples of a LED module that may be fabricated in an example embodiment.
Figure 17:
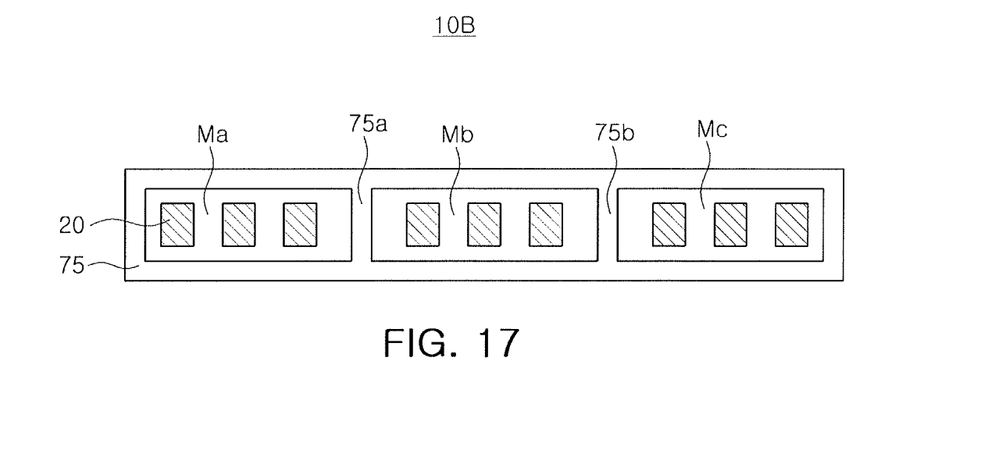
Figure 18:
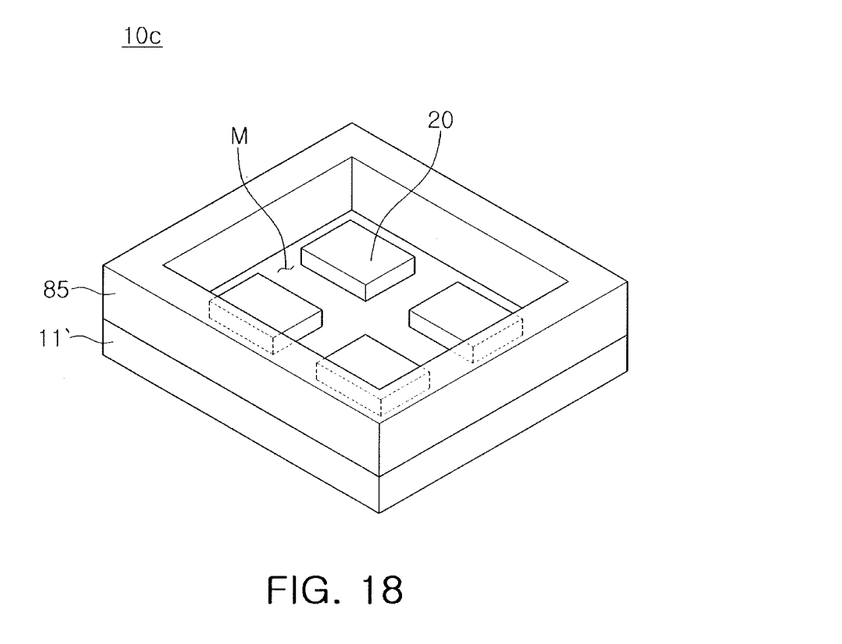

A method of fabricating a LED module, according to an example embodiment, may be used as a method of fabricating a LED module having various forms. FIGS. 16 to 18 are top views of various examples of a LED module that may be fabricated according to an example embodiment.

A LED module 10A illustrated in FIG. 16 may include the circuit board 11, a reflective laminate 65 disposed around he chip mounting region M, and a plurality of LED chips 20 disposed in the chip mounting region M.

The reflective laminate 65 may be provided as a resin layer containing a reflective powder, such as white powder. In detail, the reflective laminate 65 may be provided as one among stacked structures illustrated in FIGS. 7 to 9. In a manner different from an example embodiment described above, the reflective laminate 65 may have a form in which the reflective laminate 65 does not encompass an entirety of the chip mounting region M, but opposing ends thereof are open. The LED module 10A having a structure described above may be connected to a different LED module in an end portion thereof, and may be configured as a single LED module in which a bulkhead between modules is not present.

A plurality of LED chips 20 may be arrayed in a row. In addition, the LED module 10A may be used as a light source of a backlight unit. An LED chip 20 may be bonded to an electrode pad (see 12A and 12B in FIG. 1). A bonding process described above may be performed using a method described in FIGS. 3 to 5.

An LED module 10B illustrated in FIG. 17 may include the circuit board 11, a reflective laminate 75, and a plurality of LED chips 20, in a manner similar to the LED module 10A illustrated in FIG. 16.

The reflective laminate 75, employed in the example embodiment, may include an additional bulkhead 75a, in order to divide the chip mounting region into three regions Ma, Mb, and Mc. Bulkheads 75a and 75b may be formed in a direction perpendicular to a direction of an LED array, while the same number of LED chips 20 may be arrayed in each of regions Ma, Mb, and Mc, which are divided. Since reflective laminates are disposed adjacently to each other in the example embodiment, a solder printing process using a metal mask including a protruding portion may be used.

In a manner similar to the LED module 10A illustrated in FIG. 16, a LED module 10C illustrated in FIG. 18 may include a circuit board 11', a reflective laminate 85, and a plurality of LED chips 20. However, the LED module 10C may have a square structure, in a manner different from example embodiments described above. The chip mounting region M defined by the reflective laminate 85 may include LED chips arranged in 2×2 array. The solder printing process using a metal mask, according to the example embodiment, may be applied not only to modules in which LED chips are arrayed in a row, but also to LED modules in which LED chips are arranged in a plurality of rows.

As set forth above, embodiments provide a method of fabricating a LED module in which a solder printing process is efficiently performed. That is, the method provides a metal mask with a protruding portion, in which an injection hole is formed, such that the protruding portion extends toward a space on a circuit board surrounded by a reflective laminate. Solder is applied to electrode pads on the circuit board through the injection hole in the protruding portion, thereby increasing precision and improving efficiency. Accordingly, embodiments prevent work efficiency of a solder printing process from being degraded, due to the three-dimensional structure, i.e., with the protruding portion, disposed on the circuit board. Further, an efficient solder printing process may be performed using a metal mask including a convex (or protruding) portion.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of fabricating a light emitting diode (LED) module, the method comprising:
    preparing a circuit board, such that the circuit board includes a reflective laminate around a chip mounting region and an electrode pad in the chip mounting region;
    preparing a mask, such that the mask includes a protruding portion with a discharge hole, and the protruding portion is inserted into a space surrounded by the reflective laminate;
    dispensing solder paste onto the electrode pad using the mask; and
    bonding an electrode of a LED chip to the electrode pad of the circuit board using the solder paste.

2. The method as claimed in claim 1, wherein the reflective laminate includes a plurality of first resin layers containing a reflective powder and a plurality of bonding layers alternately stacked with the plurality of first resin layers.

3. The method as claimed in claim 2, wherein the reflective laminate further comprises a plurality of second resin layers, each second resin layer being disposed between one of the plurality of first resin layers and one of the plurality of bonding layers.

4. The method as claimed in claim 1, wherein the reflective laminate includes a resin material body having a predetermined height and a reflective resin layer coated on the resin material body and containing a reflective powder.

5. The method as claimed in claim 1, wherein the protruding portion has a structure in which a width of a lower portion of the protruding portion is less than a width of an upper portion of the protruding portion.

6. The method as claimed in claim 1, wherein:
    the mask includes a base plate and the protruding portion extending from the base plate, the protruding portion having a volumetric shape with a receiving space therein to accommodate the solder paste, and the discharge hole extending through a bottom of the protruding portion to be in fluid communication with the receiving space, and
    preparing the mask includes positioning the base plate over the reflective laminate, such that edges of the base plate extend above and overlap a top of the reflective laminate, and the protruding portion extends from the base plate along the reflective laminate toward the electrode pad on the circuit board to be at a predetermined distance from the top of the circuit board.

7. The method as claimed in claim 6, wherein dispensing the solder paste onto the electrode pad includes dispensing the solder paste from the receiving space in the protruding portion onto the electrode pad through the discharge hole, after aligning the electrode pad with the discharge hole.

8. The method as claimed in claim 1, wherein the mask includes a first metal plate including a first hole, at least one second metal plate stacked in a region of the first metal plate and including a second hole connected to the first hole, and a third metal plate stacked on the second metal plate and including a third hole connected to the second hole, the second metal plate and the third metal plate defining the protruding portion.

9. The method as claimed in claim 8, wherein the first metal plate, the second metal plate, and the third metal plate are bonded to each other in such a manner that at least one portions of external surfaces of the first metal plate, the second metal plate, and the third metal plate are welded.

10. The method as claimed in claim 8, wherein the third hole is narrower than the first hole and the second hole, the first hole and the second hole are provided as the receiving space to receive solder paste, and the third hole is provided as the discharge hole.

11. The method as claimed in claim 8, wherein the first hole is narrower than the second hole and the third hole.

12. The method as claimed in claim 8, wherein a thickness of the second metal plate is different from a thickness of at least one of the first metal plate and the third metal plate.

13. The method as claimed in claim 8, wherein the second metal plate includes a plurality of metal plates.

14. The method as claimed in claim 1, wherein the chip mounting region is provided as a region to mount a plurality of LED chips, and the electrode pad includes a plurality of electrode pads for mounting the plurality of LED chips.

15. The method as claimed in claim 1, wherein the reflective laminate includes a bulkhead structure between a plurality of chip mounting regions, in order to provide the plurality of chip mounting regions.

16. A method of fabricating an LED module, the method comprising:
    preparing a circuit board including a reflective laminate, a chip mounting region, and an electrode pad exposed in the chip mounting region;

preparing a metal mask including a protruding portion with a discharge hole;

arranging the metal mask to allow the protruding portion to be inserted into the chip mounting region;

dispensing solder paste onto the electrode pad through the discharge hole while the metal mask is arranged; and bonding an electrode of a LED chip to the electrode pad using the solder paste.

17. The method as claimed in claim 16, wherein the reflective laminate contains a reflective powder and is bonded to the circuit board by a bonding layer.

18. The method as claimed in claim 16, wherein a height of the protruding portion of the metal mask is equal to or less than a height of the reflective laminate.

19. A method of fabricating a light emitting diode (LED) module, the method comprising:

preparing a circuit board with at least one electrode pad in a chip mounting region;

forming a reflective laminate on the circuit board, such that the reflective laminate surrounds the chip mounting region;

preparing a mask, such that the mask includes a protruding portion with a discharge hole;

aligning the mask above the circuit board, such that the protruding portion is inserted into a space surrounded by the reflective laminate;

dispensing solder paste from the mask onto the electrode pad through the discharge hole; and bonding an electrode of a LED chip to the electrode pad of the circuit board using the solder paste.

20. The method as claimed in claim 19, wherein aligning the mask includes:

inserting the protruding portion into the space surrounded by the reflective laminate, such that at least a portion of the protruding portion overlaps inner sidewalls of the reflective laminate, and aligning the discharge hole of the protruding portion with the electrode pad of the circuit board, such that the electrode pad of the circuit board completely overlaps the discharge hole of the protruding portion.

* * * * *